United States Patent [19]
Saito et al.

[11] Patent Number: 5,714,878
[45] Date of Patent: Feb. 3, 1998

[54] METHOD AND SYSTEM FOR STORING WAVEFORM DATA OF DIGITAL OSCILLOSCOPE AS WELL AS METHOD AND SYSTEM FOR DISPLAYING WAVEFORM DATA THEREOF

[75] Inventors: Masanori Saito, Tokyo; Hirohisa Ishida, Tokorozawa; Mitsunobu Iwabuchi, Musashino, all of Japan

[73] Assignee: Hitachi Denshi Kabushiki, Tokyo, Japan

[21] Appl. No.: 595,219

[22] Filed: Feb. 1, 1996

[30] Foreign Application Priority Data

Feb. 2, 1995 [JP] Japan ................... 7-016190

[51] Int. Cl.[6] ............................................. G01R 13/20
[52] U.S. Cl. ............................... 324/121 R; 364/487
[58] Field of Search ..................... 324/121 R, 111, 324/112; 345/125, 134; 364/487

[56] References Cited

U.S. PATENT DOCUMENTS

| | | | |
|---|---|---|---|
| 4,837,561 | 6/1989 | Tucker | 364/487 |
| 5,039,937 | 8/1991 | Mandt et al. | 324/121 R |
| 5,530,373 | 6/1996 | Gibson et al. | 324/121 R |

*Primary Examiner*—Ernest F. Karlsen
*Attorney, Agent, or Firm*—Antonelli, Terry, Stout & Kraus, LLP

[57] ABSTRACT

An acquisition memory for storing therein and reading out digital waveform data received from an A/D converter is made up of a dual port serial access memory which stores therein the waveform data in response to a first write clock and reads out the waveform data therefrom in response to a first read clock. A display memory for writing therein and reading out therefrom the waveform data read out from the acquisition memory is made up of a dual port serial access memory which stores therein the data in response to a second write clock different from the first write clock and read out the data therefrom in response to a second read clock different from the first read clock. In a roll operational mode, whenever a predetermined number of pieces of the waveform data are stored in the acquisition memory for each passage of a predetermined period, the waveform data stored in the acquisition memory are read out in an order that the latest waveform data of all data stored in the acquisition memory is last read out therefrom, and eventually data at all addresses of the acquisition memory are read out therefrom. The display memory writes therein the data received from the acquisition memory sequentially at its addresses starting with its header address and reads out from the addresses starting with the header address and then provides the read-out data to a display unit.

18 Claims, 10 Drawing Sheets

FIG. 12

METHOD AND SYSTEM FOR STORING WAVEFORM DATA OF DIGITAL OSCILLOSCOPE AS WELL AS METHOD AND SYSTEM FOR DISPLAYING WAVEFORM DATA THEREOF

BACKGROUND OF THE INVENTION

The present invention relates to methods and systems for storing waveform data of a digital oscilloscope as well as methods and systems for displaying the waveform data thereof, and more particularly, to methods and systems for enabling storing and displaying operations of the waveform both at high speed in a roll mode.

Figure 1:
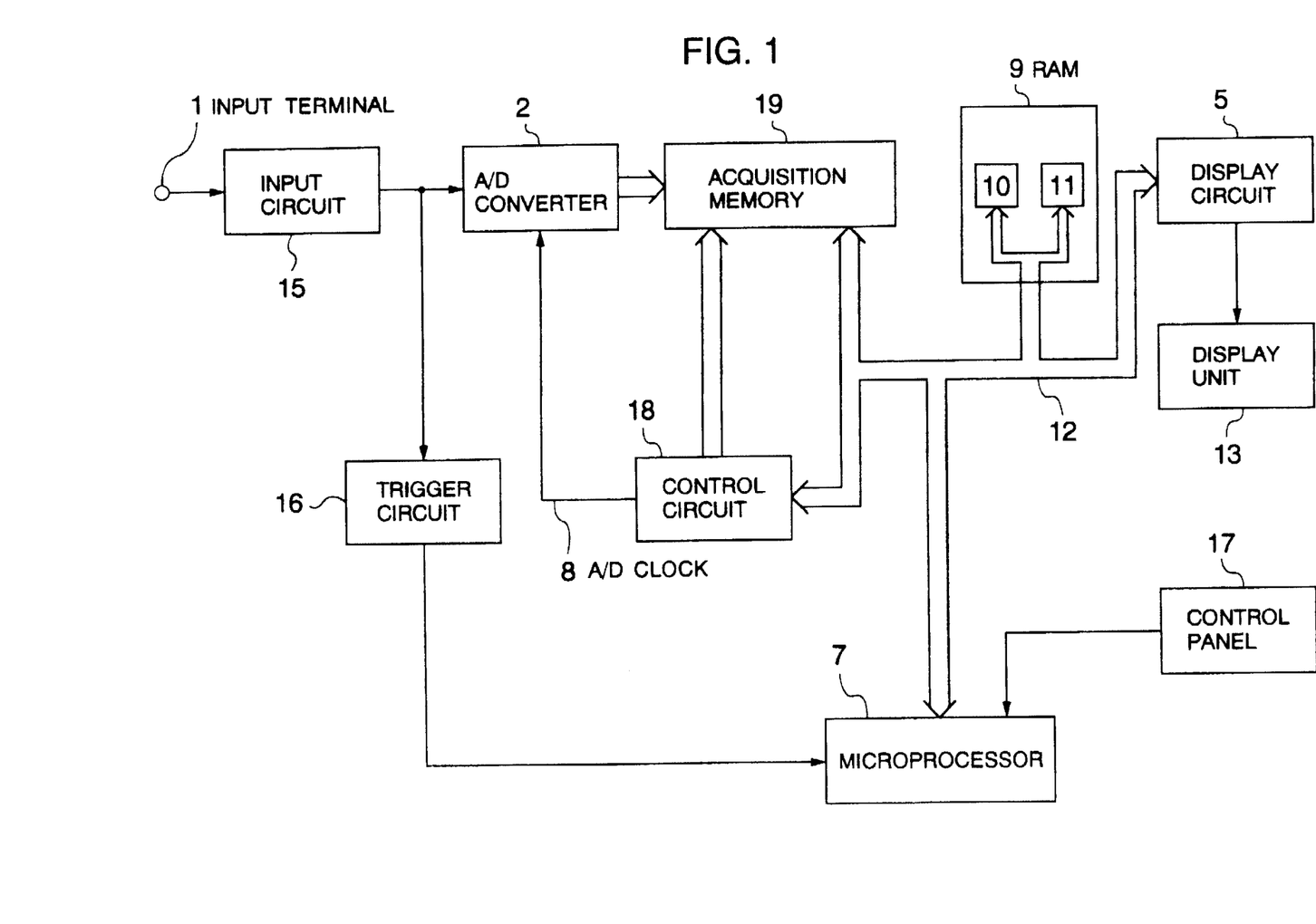
FIG. 1 is a block diagram of an exemplary schematic arrangement of a prior art digital oscilloscope.

FIG. 1 schematically shows an exemplary arrangement of a prior art digital oscilloscope which can display normal and roll modes.

In the drawing, the illustrated arrangement includes an input terminal 1 for input of an input signal to be observed, an input circuit 15 made up of an attenuator, an amplifier and so on for converting the input signal to be observed into a suitable level, an analog to digital (A/D) converter 2 for converting the input signal received from the input circuit 15 into digital data, an acquisition memory 19 made up of a RAM, a serial memory or the like for storing therein the digital data received from the A/D converter 2, a control circuit 18 for processing the data stored in the acquisition memory 19 into a format suitable for displaying the data in accordance with information set in a control or operating panel 17 and for outputting the processed data to a RAM 9, a microprocessor 7 for performing general control over the entire oscilloscope but performing control mainly over the control circuit 18, an analog to digital (A/D) clock 8, a buffer memory 10, a display memory 11, an address/data bus line 12, a display circuit 5, a display unit 13 such as a liquid crystal display (LCD) or a cathode ray tube (CRT) or the like, and a trigger circuit 16.

The digital oscilloscope, as will be well known, has roll and normal modes as real-time sampling modes.

In the roll mode, the latest waveform data are sequentially added to the right end of the display screen of the display unit 13 so that an observer can see the entire waveform as if it were moving toward its left direction. This mode is one of display modes which is the same as that of a conventional pen oscillograph and which is effective when it is desired to observe such a low-frequency signal that an observer can visually keep track of changes in the signal.

In the normal mode, on the other hand, when a trigger signal is input, waveform data corresponding to one display screen is sampled and collected from the input trigger signal so that, when the amount of the collected samples reaches one display screen, the old data appearing on the display screen is updated to the sampled latest data.

Explanation will first be briefly made as to the operation of the oscilloscope in the normal mode. In this mode, first of all, the input waveform A/D converted by the A/D converter 2 is loaded by its one display screen amount into the acquisition memory 19. The microprocessor 7 writes the data loaded in the memory 19 into the buffer memory 10 of the RAM 9 via the address/data bus line 12 and further into the display memory 11 thereof via the address/data bus line 12 in the same sequence that the acquisition memory 19 loads the data into its memory 19. Thereafter, the waveform data in the display memory 11 is sent through the display circuit 5 to the display unit 13 to be displayed thereon under control of the microprocessor 7.

Next, the operation of the prior art arrangement in the roll mode will be explained.

"Data re-arrangement" in the operation of the roll mode to be mentioned later refers to repetitive re-writing of the display memory 11 in such a manner that the latest data comes at the right end of the display screen. In this manner, upon the waveform display on the screen, the latest data is located always at the right end of the display screen and the entire data on the screen is displayed as if it were moving in its left direction by an amount corresponding to a single piece of data whenever the data is updated.

This data re-arranging operation will be explained by referring to FIG. 1 and a flowchart shown in FIG. 2 as well as also to FIGS. 3A to 3D and FIGS. 4A to 4D. The flowchart of FIG. 2 is carried out by the microprocessor 7.

Input waveform data A/D converted through the first sampling operation is loaded into the acquisition memory 19. In this connection, the sampled waveform data loaded in the acquisition memory 19 for every data re-arranging operation may be of a single piece or a plurality of pieces. However, it is in this case assumed for the simplicity of explanation that the sampled data consists of a single piece of data and the re-arranging operation is carried out whenever a single piece of the sampled waveform data is loaded into the acquisition memory 19.

Figure 2:
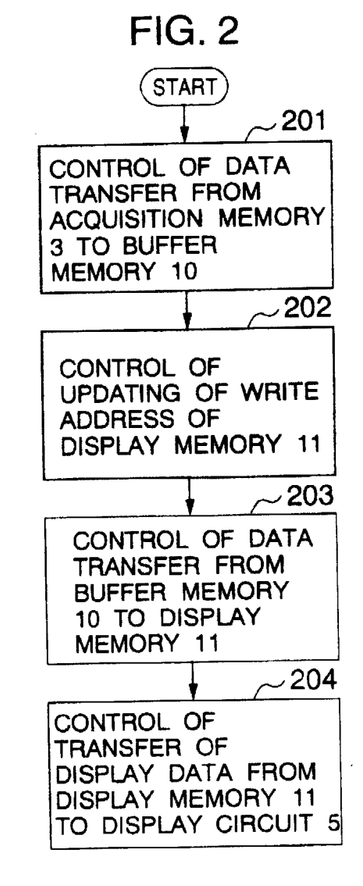
FIG. 2 is a flowchart for explaining the data re-arranging operation of the prior art digital oscilloscope of FIG. 1 in a roll mode.
Figures 3A, 3B:
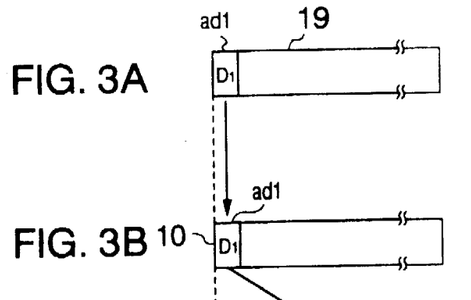
FIGS. 3A to 3D are diagrams for explaining the data re-arranging operation of the prior art digital oscilloscope of FIG. 1 in a roll mode.
Figure 3C:
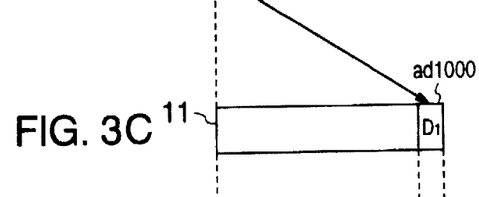

The microprocessor 7 reads out first-sampled waveform data D1 (refer to FIG. 3A) stored at an address ad1 in the acquisition memory 19 therefrom through the control of the control circuit 18, takes the read-out data thereinto via the address/data bus line 12, and loads or stores it into the buffer memory 10 at its address ad1 again through the address/data bus line 12 (refer to FIG. 3B and a step 201 in FIG. 2). Then the microprocessor 7 reads out the data d1 being stored in the buffer memory 10 therefrom, takes the read-out data thereinto, and stores it into the display memory 11 again through the address/data bus line 12. At this time, a write address to the display memory 11 is ad1000 corresponding to the right end of the display screen (see FIG. 3C). In this case, the number m of pieces of display data in the horizontal direction of the screen is assumed to be, e.g., 1000. Accordingly, addresses of the acquisition, buffer and display memories 19, 10 and 11 are assumed to be ad1 to ad1000 while the data piece number is to be 1000.

Therefore, the microprocessor 7, prior to writing the data D1 into the display memory 11, updates the write address to the display memory 11 to ad1000 (step 202), and thereafter transfers the data D1 from the buffer memory 10 to the display memory 11 to write it at the address ad1000 (step 203).

Figure 3D:
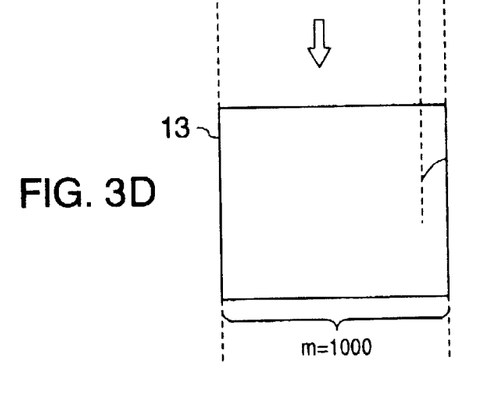
Figures 4A, 4B, 4C:
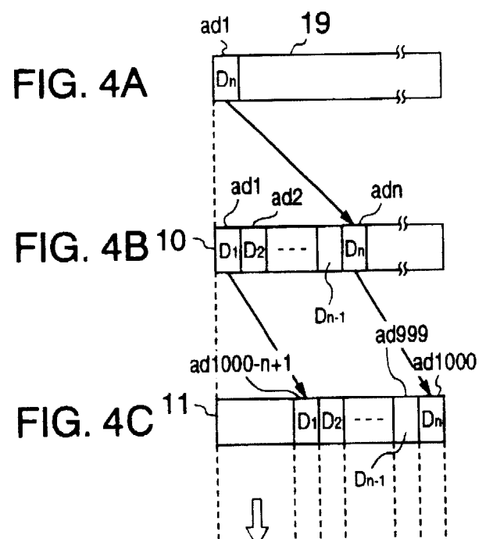
FIGS. 4A to 4D are diagrams for explaining the data re-arranging operation of the prior art digital oscilloscope of FIG. 1 in a roll mode.
Figure 4D:
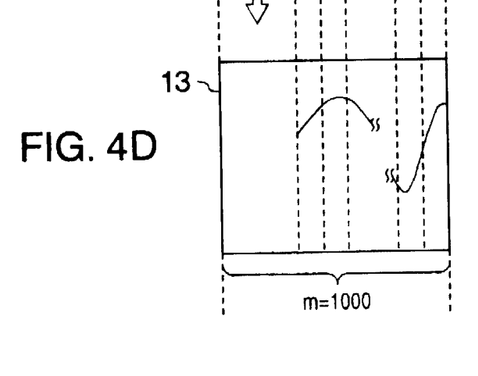

The microprocessor 7 reads out the data D1 being stored in the display memory 11 therefrom and sends it to the display circuit 5 through the address/data bus line 12 to thereby cause the data D1 to be displayed on the display screen at its right end (refer to FIG. 3D).

Similarly, data D2, which is secondly sampled and A/D converted, is stored into the acquisition memory 19 at its address ad1 to be later read out therefrom and stored into the buffer memory 10 at its address ad2. In this case, the first sampled data D1 remains at the address ad1 of the buffer memory 10. The data D1 and D2 being stored at the respective addresses ad1 and ad2 in the buffer memory 10 are both read out, and stored into the display memory 11 at their addresses ad999 and ad1000. Thus, the data D1 having been stored in the address ad1000 is updated to the data D2. Thereafter these data D1 and D2 are read out and displayed.

Explanation will next be made as to the re-arranging operation of n-th data. Data Dn n-thly sampled and subjected to the A/D conversion is stored into the acquisition memory 19 at the address ad1 (refer to FIG. 4A) to be later read out and stored into the buffer memory 10 at its address adn (refer to FIG. 4B). In this case, data D1 to Dn−1 sampled firstly to (n−1)-thly remain in the buffer memory 10. Subsequently, the data D1 to Dn being stored in the buffer memory 10 at the respective addresses ad1 to adn are read out and stored in the display memory 11 at its addresses ad(1000−n+1) to ad1000 respectively (refer to FIG. 4C) to be later read out and displayed (refer to FIG. 4D).

Such data re-arranging operation as mentioned above is repeated for each sampling operation so that, on the waveform display screen, the latest data is located at the right end of the display screen and the entire data is displayed as if it were moving by an amount of one piece of data in the left direction whenever the data is updated. Such operation is repeated so that the latest data is located always at the right end of the display screen and the display memory 11 is rewritten to cause the left-end data to disappear. That is, in the roll mode, such display is required that the waveform continuously move as in the pen oscillograph, and thus the operation ranging from the A/D conversion to the display must be continuously carried out without any breaks. Therefore, the aforementioned data re-arranging operation is required to be carried out at a high speed.

For the purpose of eliminating jerk on the display screen, the limit value of a display period is required to be set at less than about 20 msec. Thus, when the display period is set at 20 msec., it is impossible to set a time range slower than 0.2 msec./division in the roll mode in the case where an amount of movement per each movement (unit of moving amount) that the waveform is seen to smoothly move is 0.1 division (hereinafter referred to div.), for example, 1 mm.

SUMMARY OF THE INVENTION

With the aforementioned prior art, in the roll mode, the data transfer from the acquisition memory 19 to the buffer memory 10, the data transfer from the buffer memory 10 to the display memory 11, and the data transfer from the display memory 11 to the display circuit 5 are all implemented by the microprocessor 7 on a software processing basis, which results in that a lot of software-based processing is carried out by the microprocessor and a time occupied by the address/data bus line 12 becomes large. Therefore, the much the display data is the more the software processing time in the roll mode is increased. However, since the microprocessor 7 requires such processing as display control and has a limit to be able to make time to perform such data re-arranging operation, it has been difficult to make the speed of the data re-arranging operation high in the roll mode.

When it is impossible to realize a high-speed data re-arranging operation, this requires a lot of time taken between the input of the waveform data and the appearance of the waveform on the screen. This results in that it is impossible to realize the display of the waveform on the screen on a virtual real time basis, that is, the displaying operation becomes jerky or the displaying motion is not smooth. For this reason, the waveform may be erroneously recognized. Further, when the display period (a period for refreshing the display screen) is longer than the waveform period, the waveform to be moved functionally from the right to left of the screen may be recognized as the waveform moving in the opposite direction (from the left to right) due to a relationship between the waveform and display periods. In this way, when a high-speed data re-arranging operation cannot be realized, it is difficult to obtain a high quality of display.

It is therefore an object of the present invention to provide a method and system for storing waveform data of a digital oscilloscope at a high speed in a roll mode as well as a method and system for displaying the waveform data at a high speed in the roll mode, both eliminating the above defects in the prior art.

Another object of the present invention is to provide a method and system for storing waveform data of a digital oscilloscope as well as a method and system for displaying the waveform data, which can eliminate the need for provision of a buffer memory and can realize data transfer to a display circuit in a roll mode without any need to re-arrange data on a software processing basis.

In accordance with an aspect of the present invention, there is provided a system for storing waveform data on a digital oscilloscope which comprises an input circuit for inputting a signal to be observed, subjecting the input signal to a level adjustment to obtain a level-adjusted observation signal and outputting the observation signal; an analog-to-digital (A/D) converter, in response to a sampling clock, for converting the signal received from the input circuit into digital waveform data and outputting the digital waveform data; an acquisition memory of a dual port, serial access type for storing therein, in response to a first write clock synchronized with the sampling clock, the digital waveform data received from the A/D converter and for reading therefrom, in response to a first read clock, the data stored therein; a display memory of the dual port, serial access type for storing therein, in response to a second write clock, the waveform data read out from the acquisition memory and for reading out therefrom, in response to a second read clock, the data; and a clock generation circuit for generating the first and second write clocks and the first and second read clocks, and wherein the clock generation circuit provides the first write and read clocks to the acquisition memory so that, in a roll operational mode, whenever a predetermined number of pieces of the waveform data are stored in the acquisition memory for each passage of a predetermined period, the waveform data stored in the acquisition memory are read out in an order that the latest waveform data newly stored in the acquisition memory is last read out therefrom, and eventually data at all addresses of the acquisition memory are read out therefrom.

In the present invention, each of the acquisition and display memories is made up of a dual port serial access memory which can control their write and read addresses respectively independently, these memories are connected in series so that, in the roll mode, data transfer from the acquisition memory having the digital waveform data stored therein to the display memory and data re-arranging operation thereof can be realized only through control of the write and read clocks to these memories. Accordingly, in the roll mode, the need for the microprocessor to perform data re-arranging operation based on software can be eliminated and thus the data arrangement in the display memory can be associated with the data arrangement on the display screen of the display unit in a 1:1 relation therebetween.

In this way, since the data transfer can be implemented without any need for the data re-arranging operation based on software, high-speed data display can be realized in the roll operational mode. For this reason, the transmission rate can be improved and thus the dead time for data loading can be made short, realizing a high-speed roll mode.

In the present invention, further, since the interconnection of the acquisition and display memories can be effected by means of a dedicated bus other than the bus of the microprocessor, the burden imposed on the microprocessor can be lightened. For this reason, even during the transfer of the waveform data, the microprocessor can perform other operations.

This enables the oscilloscope to have a good response performance to inputs. Likewise, since the microprocessor is sufficient to less operate, the power consumption can be correspondingly reduced. Further, when it is desired to realize an equivalent high-speed roll mode, this requires a higher speed re-arranging operation and a microprocessor operable at a higher speed, with the result that the microprocessor is inevitably expensive. According to the present invention, since such an expensive microprocessor can be avoided, the manufacturing cost can be reduced.

In the invention, furthermore, a time taken from data input to screen display thereof is shortened so that the screen display can be done on a virtual real-time basis with smooth movement of the waveform display. In addition, in virtue of a relationship between the waveform period and display period, when the display period is longer than the waveform period, the waveform is visually recognized by a user or observer as if it were being moved from left to right, though the waveform should seem to be moved from right to left oppositely. In the invention, such an opposite movement can be prevented. For this reason, there can be realized a digital oscilloscope which can produce a high quality of waveform display, while preventing the user from erroneously recognizing the waveform.

In accordance with another aspect of the present invention, the clock generation circuit resets the write addresses of the acquisition at the initial stage of the roll operational mode, and thereafter and prior to generation of the first write clock, provides the clocks corresponding in number to the number m (dot number) of display pieces of data of the display unit in a horizontal direction to the acquisition memory as the write clocks to advance the write address of the acquisition memory by a number m.

Therefore, even when the data capacity n of the acquisition and display memories is larger than the display data piece number n (dot number) of display screen of the display unit in the horizontal direction, the latest data can be displayed always at the right end of the display screen in the roll operational mode.

In the present invention, even when the data piece number of the display screen is smaller than the data piece number (address number) of the acquisition and display memories, the time taken from data input to screen display thereof can be made short.

DESCRIPTION OF THE PREFERRED EMBODIMENTS

A digital oscilloscope in accordance with an embodiment of the present invention will be detailed with reference to the accompanying drawings. In these drawings, constituent elements having the same functions as those in FIG. 1 are denoted by the same reference numerals and symbols and explanation thereof is omitted.

Figure 5:
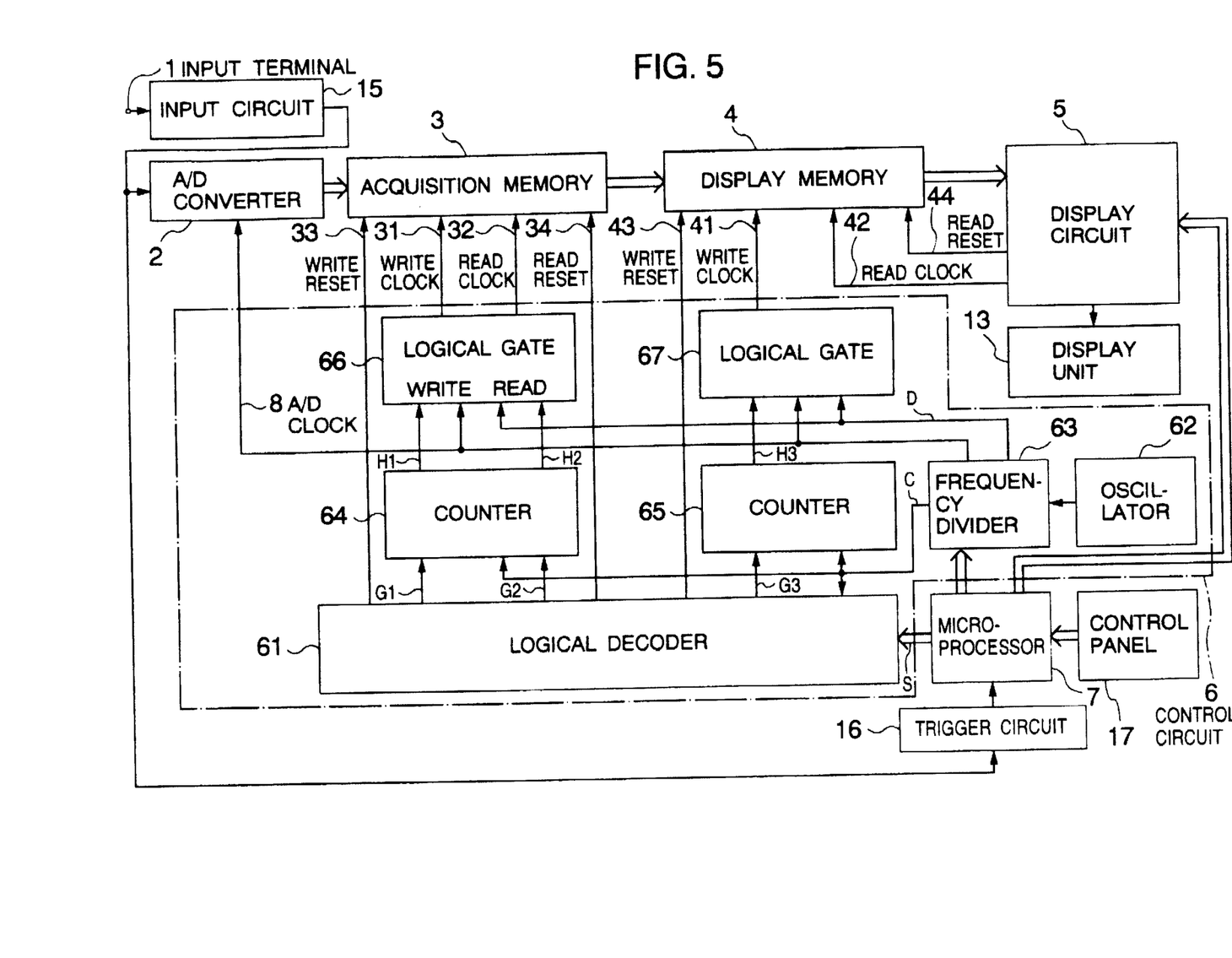
FIG. 5 is a block diagram of an arrangement of a digital oscilloscope in accordance with an embodiment of the present invention.

Referring first to FIG. 5, there is shown a block diagram of an arrangement of a digital oscilloscope in accordance with an embodiment of the present invention, which includes an acquisition memory 3, a display memory 4 and a control circuit 6.

FIGS. 6A to 6F are diagrams for explaining the operation of the embodiment of FIG. 5 in a roll mode, that is, depicting the writing and reading operations of the acquisition memory 3 and display memory 4 and waveforms displayed on a display unit 13 in the roll mode.

Figure 7:
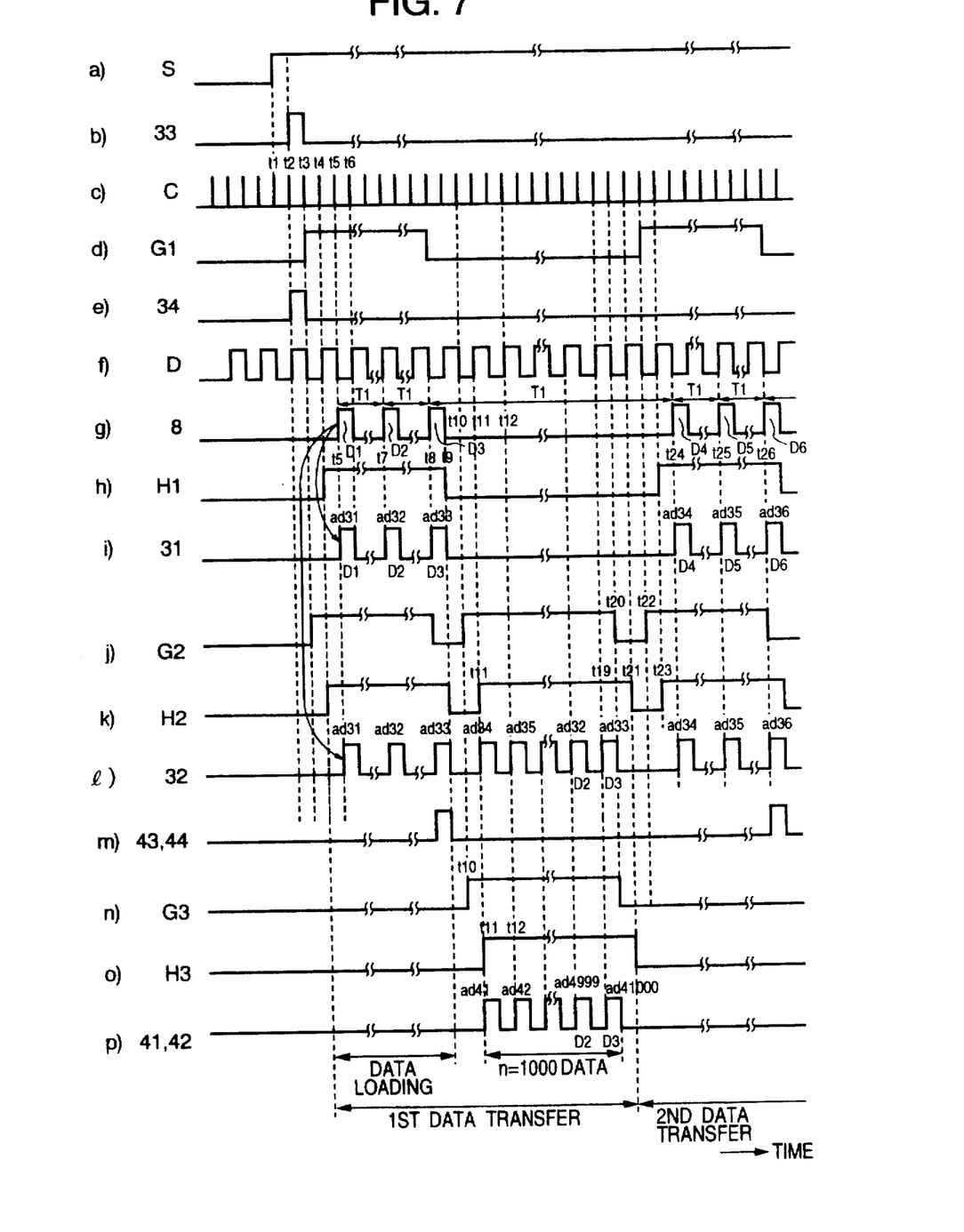
FIG. 7 is a timing chart showing the waveforms of signals appearing at various points in FIG. 5 for explaining the operation of the embodiment of FIG. 5 in the roll mode.
Figure 8:
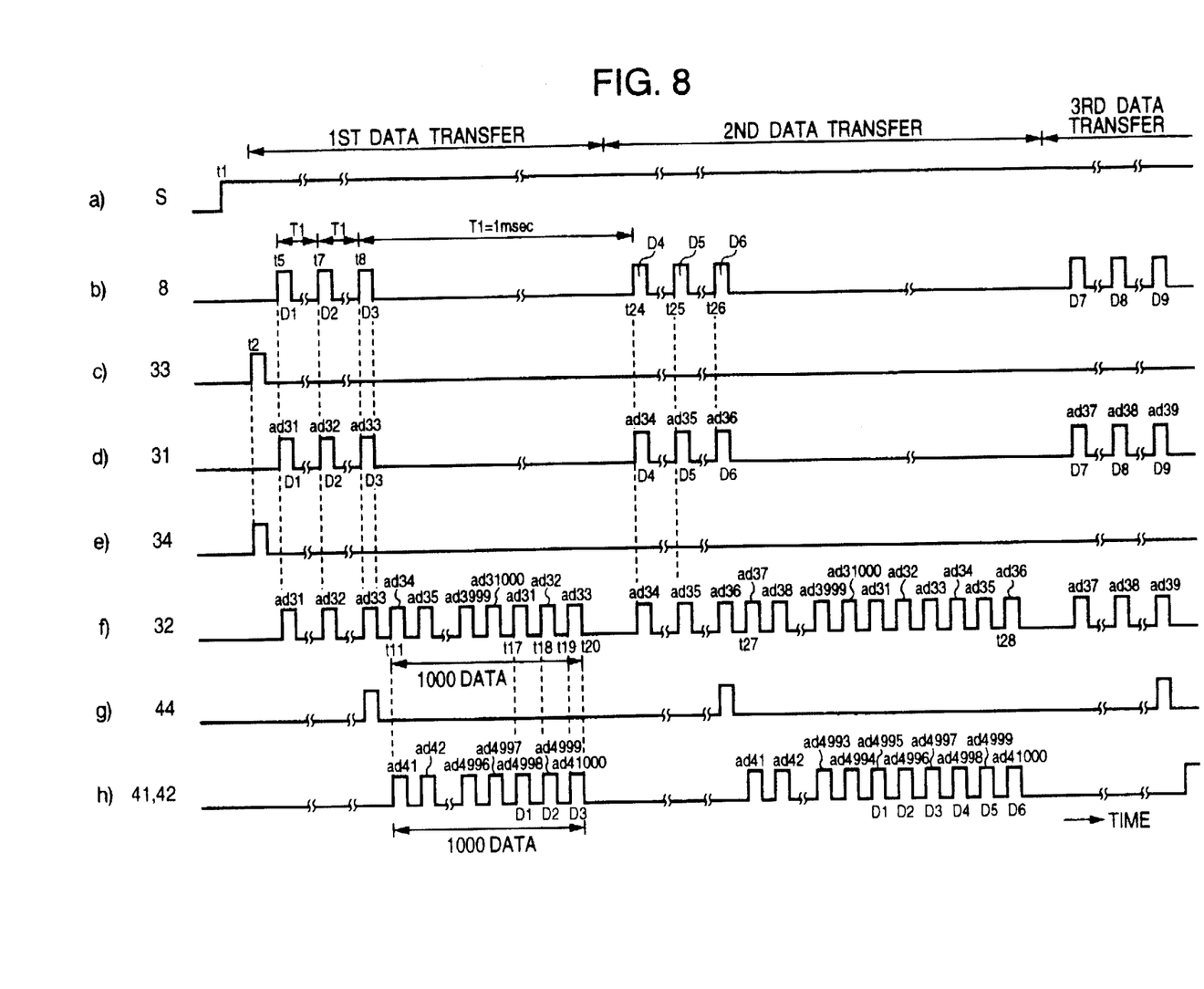
FIG. 8 is a timing chart showing the waveforms of signals appearing at various points in FIG. 5 for explaining the writing and reading operations of the acquisition memory and display memory in the embodiment of FIG. 5 in the roll mode.

FIGS. 7 and 8 are timing charts showing waveforms of signals appearing at various points in FIG. 5 for explaining the operation of the embodiment of FIG. 5 in the roll mode.

The acquisition memory 3 and display memory 4 used herein are of a dual port, serial access type which allows individual writing and reading operations. In these memories, write and read addresses are designed to individually sequentially advance in response to respective write and read clocks. An example of such a dual port type serial access memory is a memory known as HM63021 (trade name) made by Hitachi Ltd.

The display unit 13 may be a cathode ray tube (CRT) or a monochrome or color matrix display such as typical known liquid crystal display (LCD) or an electronic luminescence (EL) display or the like.

The control circuit 6 has a logic decoder 61, an oscillator 62, a frequency divider 63, counters 64 and 65, and logical gates 66 and 67.

The operation of the present embodiment in the roll mode will then be briefly explained by referring to FIGS. 6A to 6F. In the present embodiment, the data capacity n of each of the acquisition memory 3 and the display memory 4 is set to be the same as the display data amount (dot number) m of the display unit 13 in the horizontal direction, e.g., to be n=m= 1000.

Figure 6A:
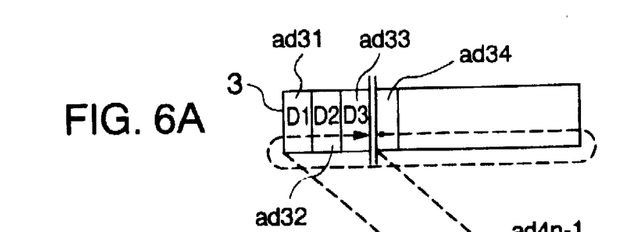
FIGS. 6A and 6D are diagrams for explaining the writing and reading operations of an acquisition memory in a roll mode of the embodiment of FIG. 5 respectively.
Figure 6B:
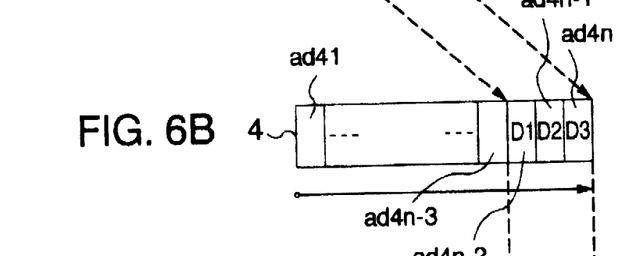
FIGS. 6B and 6E are diagrams for explaining the writing and reading operations of a display memory in a roll mode of the embodiment of FIG. 5 respectively.
Figure 6C:
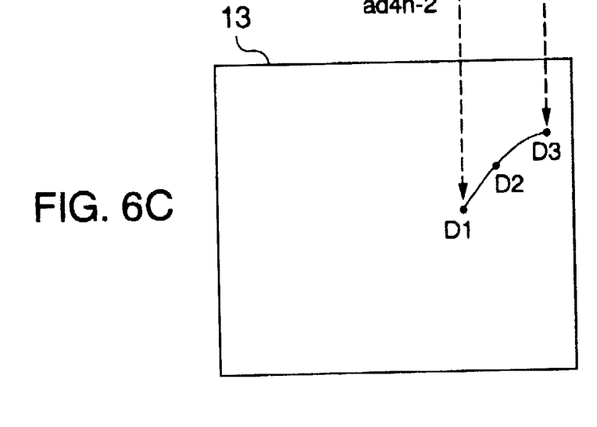
FIGS. 6C and 6F are waveforms displayed on a display unit in a roll mode of the embodiment of FIG. 5 respectively.
Figure 6D:
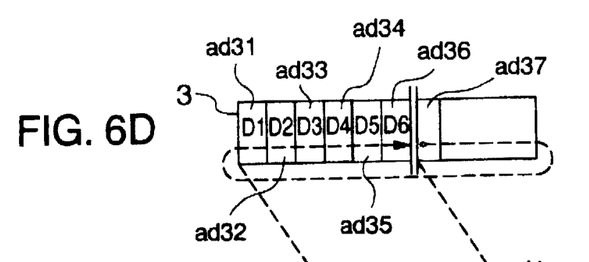
Figure 6E:
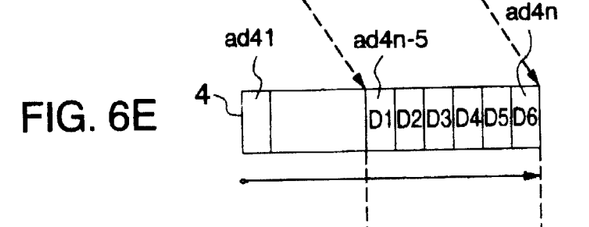

Explanation will be made, as an example, in connection with a case where one data transfer operation is carried out for every 3 sampling operations (that is, sampling of 3 data). The A/D converter 2 loads the A/D converted data into the acquisition memory 3 in response to an A/D clock 8 as a sampling clock pulse. At this time, the write and read addresses of the acquisition memory 3 are simultaneously advanced in response to write and read clocks 31 and 32 respectively. As shown in FIG. 6A, the acquisition memory 3 stores such data sequentially inputted as data D1, D2 and D3 in response to the A/D clock 8 at addressed ad31, ad32 and ad33 respectively in response to the write clock 31, at which time the acquisition memory 3 stops the write clock 31 to stop the updating operation of the write address. Then the read address of the acquisition memory 3, in response to the read clock 32, advances to the next address ad34 in such a manner that the next sequential reading operation is started from the data of the address ad34. The write address of the display memory 4 sequentially starts with the reset address, i.e., the start address ad41 and the data of the acquisition memory 3 are sequentially written thereat. Subsequently, the latest data D1, D2 and D3 loaded through the first sampling operation are stored at three addresses ad4(n-2), ad4(n-1) and ad4n antecedent immediately to last one adn of the write addresses of the display memory 4, as shown in FIG. 6B. Therefore, when the data of the display memory 4 are read out sequentially from the read address ad41 and sent to the display circuit 5, the latest waveform data is displayed at the right end of the display unit 13 as shown in FIG. 6C.

In the second data sampling and data transfer operations, data D4 is written, in response to the write clock 31, at the next address ad34 of the acquisition memory 3. Subsequently, data D5 and D6 are sequentially written at addresses ad35 and ad36 respectively.

In this way, data D1, D2, D3, D4, D5 and D6 are sequentially stored at their addresses of the acquisition memory 3 starting with the start address ad31 as shown in FIG. 6A. Data transfer from the acquisition memory 3 to the display memory 4 is carried out in such a manner as to be explained below. That is, the address reading operation of the acquisition memory 3 starts with an address ad37 next to the address ad36 at which the data is lastly written at the time of the second data transfer. The write address of the display memory 4 is reset for each writing operation and data received from the acquisition memory 3 is written at the addresses starting again with the address ad41. Accordingly, the this-time data D4, D5 and D6 are written at the addresses ad4(n-2), ad4(n-1) and ad4n (see FIG. 6E). As a result, the latest data D6 is stored in such a manner that the latest data appears at the right end of the display unit 13 (see FIG. 6F).

In this way, the third, fourth and subsequent data sampling an data transfer operations are repeated so that the latest data sequentially appears always at the right end of the screen of the display unit 13.

Next, the operations of the respective constituent elements of the present embodiment of FIG. 5 in the roll mode will be explained in detail with use of timing charts shown in FIGS. 7 and 8.

In the illustrated example, a sweep time range is set to be 0.1sec./div. and the display screen is set to be divided into 10 div. with 1,000 display data for 10 div., as an example. Under such conditions, the sampling A/D clock 8 has a frequency of 1 kHz (a period T1 of 1 msec).

The control panel 17 can set the sweep time range and also can set either one of the normal and roll modes. When the roll mode is set through the control panel 17, the microprocessor 7, in response to the set sweep time range, gives information necessary for the setting of the roll mode to the logical decoder 61, frequency divider 63 and display circuit 5.

The oscillator 62 generates a clock signal having a predetermined frequency and gives it to the frequency divider 63. The frequency divider 63 in turn divides the clock signal received from the oscillator 62 with respect to frequency into clock signals C and D and A/D clock signal 8 in accordance with the set information received from the microprocessor 7.

The clock signal D (FIG. 7, (f)) corresponds to, e.g., the clock signal C (FIG. 7, (c)) but having a frequency corresponding to ½ the frequency thereof; while the A/D clock 8 (FIG. 7, (g)) corresponds to, the clock signal D but having a frequency corresponding to a division of the frequency thereof. The clock signal C (FIG. 7, (c)) is given to the logical decoder 61 and counters 64 and 65, the clock signal D is given to the logical gates 66 and 67, and the A/D clock 8 is given to the A/D converter 2 and logical gates 66 and 67.

Thereafter, the microprocessor 7 generates a start signal S (FIG. 7, (a); FIG. 8 (a)) (of a high level) at a time t1 and gives it to the logical decoder 61. In response to the start signal S, the logical decoder 61 generates various sorts of signals which follow in accordance with the set information received from the microprocessor 7.

First, in response to the next clock C of the start signal S, the logical decoder 61 generates a write reset signal 33 (FIG. 7, (b); FIG. 8, (c)) and a read reset signal 34 (FIG. 7, (e); FIG. 8, (e)) for the acquisition memory 3 at a time t2 and provides these signals to the acquisition memory 3 to reset (or initialize) the write and read addresses of the acquisition memory 3. The logical decoder 61, in response to the next clock signal C, generates at a time t3 a gate signal (of a high level) G1 (FIG. 7, (d)) for the write operation of the acquisition memory 3 and a gate signal (of a high level) G2 (FIG. 7, (j)) for the read operation thereof and provides these gate signals to the counter 64. The gate signals G1 and G2 are generated for a time duration of from the time t3 to a time t8 at which third one of 3 A/D clock pulses to be generated after the time t3 is generated, i.e., these gate signals are changed to its high level. The logical decoder 61 generates a write reset signal 43 (FIG. 7, (m); FIG. 8, (g)) for the display memory 4 at a time t8 at which the input gate signals G1 and G2 are changed to their low level, and provides it to the display memory 4. The logical decoder 61, in response to the second clock C, also generates at a time t10 an input a gate signal G3 for the write operation of the display memory 4, that is, changes the level of the gate signal G3 to its high level, and thereafter keeps it at its high level for a time duration until a time t20 (during which 1,000 clocks D corresponding to the display data piece number are generated or 1,000 write clocks 41 for the display memory 4 are generated).

The counter 64 counts the clocks C while the gate signals G1 and G2 are at high level. Thereafter, for a time duration until the count value reaches a predetermined level (for example, a value corresponding to the number of the clocks D corresponding to 3 A/D clocks 8 generated thereafter), that is, for a time duration of times t4 to t9, the counter 64 generates a gate signal H1 (FIG. 7, (h)) for the write operation of the acquisition memory 3 and a gate signal H2 (FIG. 7, (k)) for the read operation thereof; and then provides these gate signals to the logical gate 66.

The counter 65 counts the clocks C while the gate signal G3 is at high level. Thereafter, for a time duration until the count value reaches a predetermined level (for example, a value corresponding to 1,000 of the clocks D generated thereafter), that is, for a time duration of times t11 to t21, the counter 65 generates a gate signal H3 (FIG. 7, (o)) for the write operation of the 4; and then provides the gate signal to the logical gate 67.

In response to the gate signal H1, the logical gate 66 provides the A/D clocks 8 being received during the high level of the signal H1, i.e., in the write mode of the acquisition memory 3 to the acquisition memory 3 as the write clock 31 (FIG. 7, (i); FIG. 8, (d)). In response to the gate signal H2, the logical gate 66 also provides the clocks D being received during the high level of the signal H2, i.e., in the read mode of the acquisition memory 3 to the acquisition memory 3 as the read clock pulse 32 (FIG. 7, (l); FIG. 8, (f)). Accordingly, the write and read clocks 31 and 32 are given to the acquisition memory 3 at times t5, t7 and t8 so that the write and read addresses of the acquisition memory 3 are both updated to ad31, ad32 and ad33.

Subsequently, the gate signal G2 is changed again to its high level at the time t10 so that the gate signal G2 is kept at the high level for a time duration until the number of such clocks D generated thereafter becomes 1,000, i.e., for a time duration of the times t10–t20. Thus, the counter 64 counts the clock pulses C during the high level of the gate signal G2. Thereafter, for a time duration until the count value reaches a predetermined level (for example, a value corresponding to 1,000 of the clocks D generated thereafter), that is, for the time duration of the times t11 to t21, the counter 64 generates the gate signal H2 for the write operation of the acquisition memory 3; and then provides the gate signal to the logical gate 66.

In response to the gate signal H2, the logical gate 66 provides 1,000 of the clocks D being sequentially received during the high level of the gate signal H2 to the acquisition memory 3 as the read clock 32.

Thus, during a time duration of times t11–t20, 1,000 of the read clocks 32 are sequentially provided to the acquisition memory 3 so that only the read addresses of the acquisition memory 3 are sequentially updated to ad34, ad35, . . . , ad3999, ad31000, ad31, ad32, and ad33.

Since the gate signal H3 for the write operation of the display memory 4 is provided to the logical gate 67 during this time period (of the times t11–t21), the logical gate 67 provides to the display memory 4 as the write clock 41 (FIG. 7, (p); FIG. 8, (h)) 1,000 of the clocks D sequentially received during the high level of the gate signal H3. Thus, during the time period of the times t11–t20, 1,000 of the write clocks 41 are sequentially provided to the display memory 4 so that the write address of the display memory 4 is sequentially updated to ad41, ad42, ad43, . . . , ad4999, and ad41000.

This example is designed so that the display circuit 5 generates the read reset pulse 44 (FIG. 7, (m); FIG. 8, (g)) synchronized with the write reset pulse 43 and provides it to the display memory 4 and the display circuit 5 also generates the read clock 42 (FIG. 7, (m); FIG. 8, (g)) synchronized with the write clock 41 and provides it to the display memory 4. Accordingly, during the time period of the times t11–t19, 1,000 of the read clocks 42 are sequentially provided to the display memory 4 so that the read address of the display memory 4 is sequentially updated to ad41, ad42, ad43, . . . , ad4999 and ad41000.

In this way, the first data transfer is carried out among the A/D converter 2, acquisition memory 3 and display memory 4.

Thereafter, in synchronism with the rising edge of the next clock D after the time t20, the gate signals G1 and G2 are changed again to the high level at a time t22, the gate signals H1 and H2 are changed to the high level at a time t23. As in the above, the write clock 31 and read clock 32 (FIG. 7, (i) and (l); FIG. 8, (d) and (f)) are provided to the acquisition memory 3 at times t24, t25 and t26. As a result, the write and read addresses of the acquisition memory 3 are updated to ad34, ad35 and ad36 respectively. In a similar manner to in the first data transfer case, the second data transfer is carried out.

The data transfer operation will be explained below by referring to FIGS. 7 and 8.

Explanation will first be made as to the first data sampling and data transfer operations. The A/D converter 2, in response to the A/D clocks 8, sequentially subjects input data to sampling and A/D converting operation and provides its result to the acquisition memory 3.

The acquisition memory 3 resets the write and read addresses with use of the write and read reset pulses 33 and 34 at the time t2. Thereafter, the write clock 31 is provided to the acquisition memory 3 at the times t5, t7 and t8, so that the data D1, D2 and D3 received from the A/D converter 2 are sequentially stored at the addresses ad31, ad32 and ad33 respectively in response to the write clocks 31.

Simultaneously, the read clock 32 is also provided to the acquisition memory 3 so that the read addresses are updated to ad31, ad32 and ad33. Thus, though the data at these addresses can be read out, the display memory 4 is not put in its data writable state yet and therefore the data cannot be written in the display memory 4.

At the time t8, the write and read reset pulses 43 and 44 are provided to the display memory 4 to reset the write and read addresses. During a time period of the times t11–t10 thereafter, the read write clock 32 is provided to the acquisition memory 3 and the write and read clocks 41 and 42 are sequentially provided to the display memory 4 respectively by n (which is set at 1,000 identical to the display data piece number, in this example).

Data of addresses ad34, ad35, . . . , ad3999, and ad31000 of the acquisition memory 3 are sequentially read out and the data D1, D2 and D3 at the addressed ad31, ad32 and ad33 are read out at the times t17, t18 and t19, these data being provided to the display memory 4. Thus, the data D1, D2 and D3 are sequentially stored at the addressed ad4998, ad4999 and ad41000 of the display memory 4. Simultaneously, these data are sequentially read out and sent via the display circuit 5 to the display unit 13 to be displayed thereon. As a result, the waveform data D3 is displayed on the right end of the display screens shown in FIG. 6C.

Figure 6F:
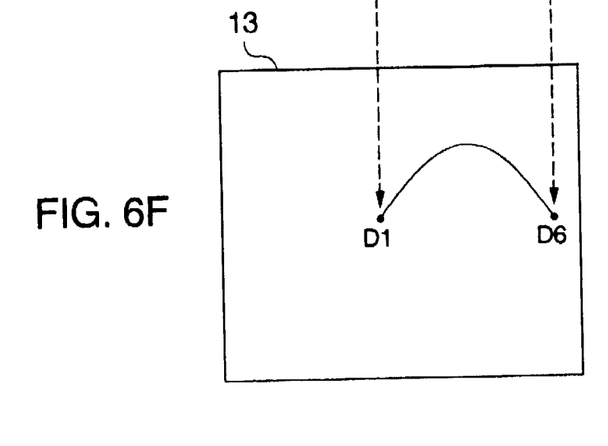

Similarly, in the second data sampling and data transfer operations, new data D4, D5 and D6 subjected by the A/D clock 8 to the sampling and A/D converting operations are stored in the acquisition memory 3 at addresses ad34, ad35 and ad36 respectively at times t24, t25 and t26. At times t27–t28, the data already stored at the addresses ad37 to ad3999 and ad31000 of the acquisition memory 3 as well as the data D1 to D6 already stored at the addresses ad31 to ad36 are sequentially read out and stored sequentially at addresses ad41 to ad41000 of the display memory 4. That is, the this-time new data D4, D5 and D6 are stored at the final addresses ad4998, ad4999, ad41000. At the same time, these data stored at the addresses ad41 to ad41000 of the display memory 4 are sequentially read out and displayed on the display screen of the display unit 13. As a result, the waveform data D6 appears at the right end of the display screen as shown in FIG. 6F.

Even in the third and subsequent data sampling and data transfer operations, the latest sampled data is similarly always added to the right end of the display screen as if the waveform were being moved. In this connection, the read and write clock frequency for the data transfer of the memory should be set to be within the period T1 of the sampling clock (1 msec. in FIGS. 7 and 8), and even when the transfer is carried out with a clock having a frequency of 30 MHz, the read/write clock frequency should be set to be 34 sec with respect to 1,000 pieces of data.

In other words, when it is desired to transfer 1,000 pieces of data with a clock having a frequency of 30 MHz, a high-speed roll mode up to 5 msec./div. can be realized.

In this way, when the write clock number to the acquisition memory 3 and the transfer clock number from the acquisition memory 3 to the display memory 4 are separately controlled, the roll mode display can be attained.

Since the acquisition memory 3 and the display memory 4 are both of a dual port, serial access type where writing and reading can be separately carried out in the illustrated example, the address thereof sequentially advances for each clock.

Although the writing operation of the display memory 4 has been supposed to be synchronously carried out simultaneously with the reading operation thereof in the foregoing embodiment, the reading operation of the display memory 4 under control of the display circuit 5 may be carried out independently of the writing operation of the display memory 4 in accordance with the refresh rate (which depends on the used display type such as LCD or CRT) of the display unit 13.

Further, explanation has been made in connection with the case where the data transfer is carried out between memories on every 3 waveform data basis in the foregoing embodiment. However, the data transfer may be carried out on each waveform data basis or on a plural (other than 3) waveform data basis in the similar manner to the above.

Explanation will then be made as to a second embodiment of the present invention.

In the foregoing embodiment, there occurs no problem utterly on the display of the waveform data so long as the capacity of the display memory 4 coincides with the display data length of the display unit 13 (that is, they satisfy a 1:1 relationship. The capacity of a memory is being recently increased year after year. Since the amount of data displayable on a display unit is limited by the resolution of the display unit, however, it is general that the display unit has a display capacity less than the capacity of the memory. That is, it is difficult to find a display memory available in the market which has a capacity equal to the display data amount of the display unit.

Figures 9A, 9B:
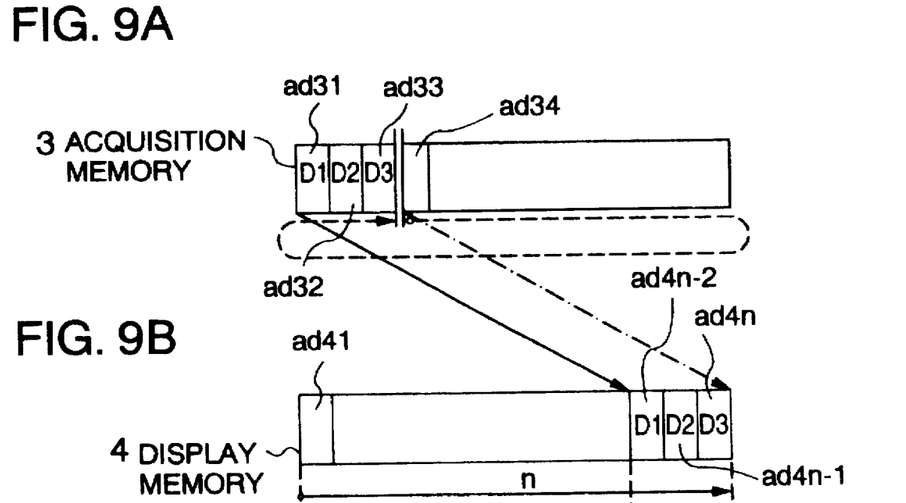
FIGS. 9A to 9C are diagrams for explaining an example of data re-arranging operation in the roll mode of the digital oscilloscope when the data capacity of the display memory is different from the display data amount of the display unit.
Figure 9C:
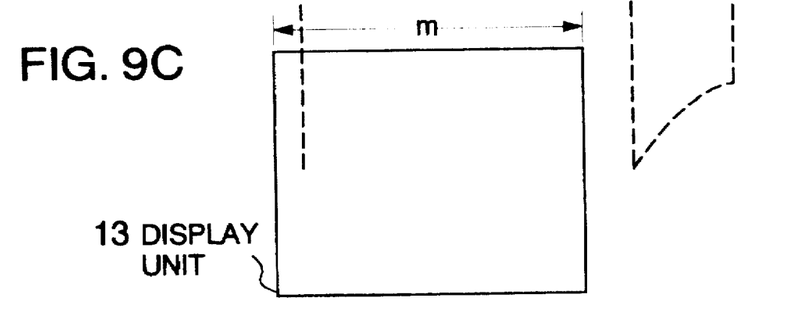

Shown in FIGS. 9A to 9C are diagrams for explaining an exemplary roll operational mode of the system when the data capacity n of the display memory 4 is different from the display data amount m of the display unit 13, and in particular, when the screen display data piece number m is smaller than the data piece number n (address number) of the acquisition memory 3 or display memory 4. Further, it is assumed in the following explanation that the header address ad41 of the display memory 4 corresponds to the left end of the display screen of the display unit 13.

Explanation will be briefly made under the above conditions as to a case where data transfer is carried out in the same manner as in the operation explained in connection with FIGS. 6A to 6F, by referring to FIGS. 9A to 9C.

The waveform data D1, D2 and D3 subjected to the A/D conversion are placed at the write addresses ad31, ad32 and ad33 of the acquisition memory 3 to stop the updating of the write address as shown in FIG. 9A. Then the read address of the acquisition memory 3 is read out starting with the address ad34 next to the stopped address. As shown in FIG. 9B, data are written in the display memory 4 starting with the reset write address, i.e., with the header address ad41, and the latest sampled input data D1, D2 and D3 are stored at the write addresses ad4(n−2), ad4(n−1) and ad4n immediately prior to the last write address. Since the display capacity m (dot number) of the display unit 13 is smaller than the data storage capacity n of the display memory 4 as shown in FIGS. 9B and 9C, however, this means that the first transfer of the data D1 to D3 will not be displayed on the display unit 13. In this way, the second, third, fourth, . . . operation are repeatedly carried out, which results in that, when the read addresses are read out into the display circuit 5 starting sequentially with the read address ad41, the waveform eventually appears at the right end of the screen of the display unit 13. When the address number of the display memory is set to be n and the dot number of the screen of the display unit 13 in an X direction (horizontal direction) is set to be m as shown, e.g., in the example of FIG. 9C, the data will not appear on the display screen so long as the addresses corresponding to a difference (n−m) therebetween are not filled.

In this way, there occurs such a problem that it takes a lot of time before the waveform data to be observed appears on the display screen.

The second embodiment of the present invention is intended to solve such a problem when the data capacity of the display memory 4 is different from the display data amount of the display unit 13.

The present embodiment has substantially the same in arrangement as the embodiment of FIG. 5, except that the function of the logical decoder 61, etc. are different from those in the first embodiment, which will be explained below.

Figure 10A:
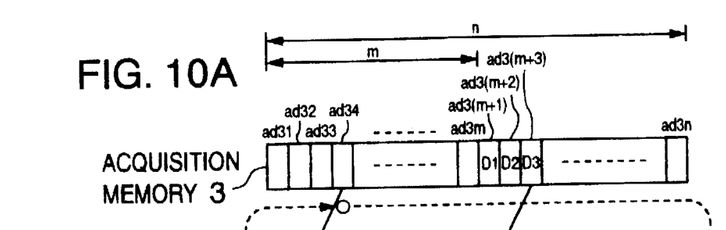
FIGS. 10A to 10F are diagrams for explaining the data re-arranging operation of another embodiment of the present invention in its roll mode.
Figure 10B:
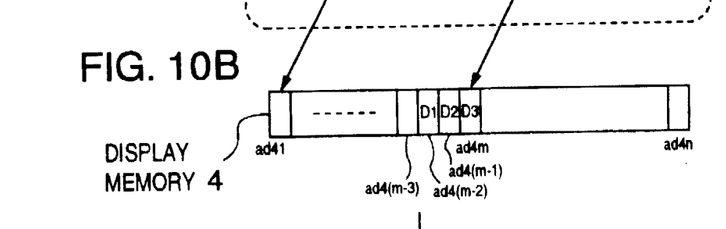
Figure 10C:
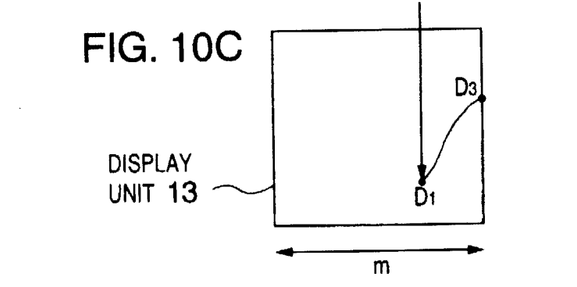
Figure 10D:
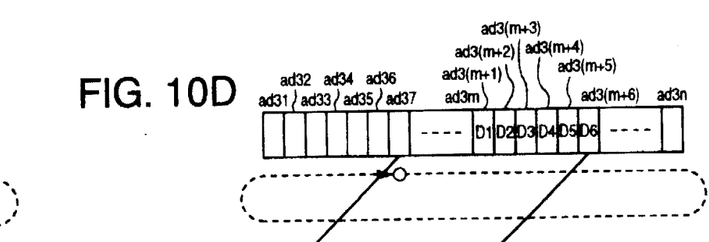
Figure 10E:
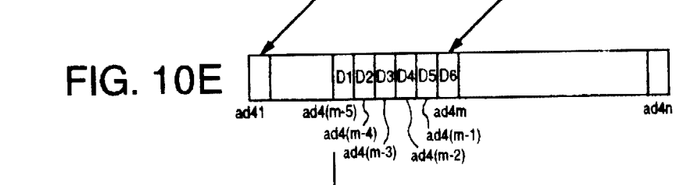
Figure 10F:
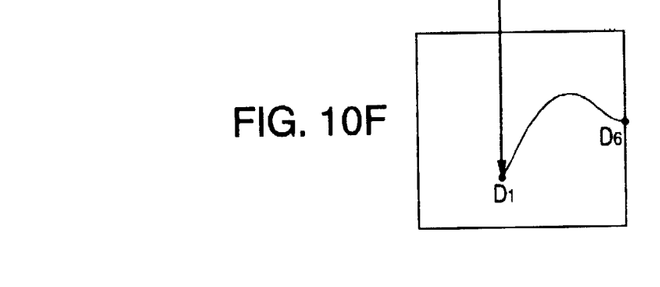
Figure 11:
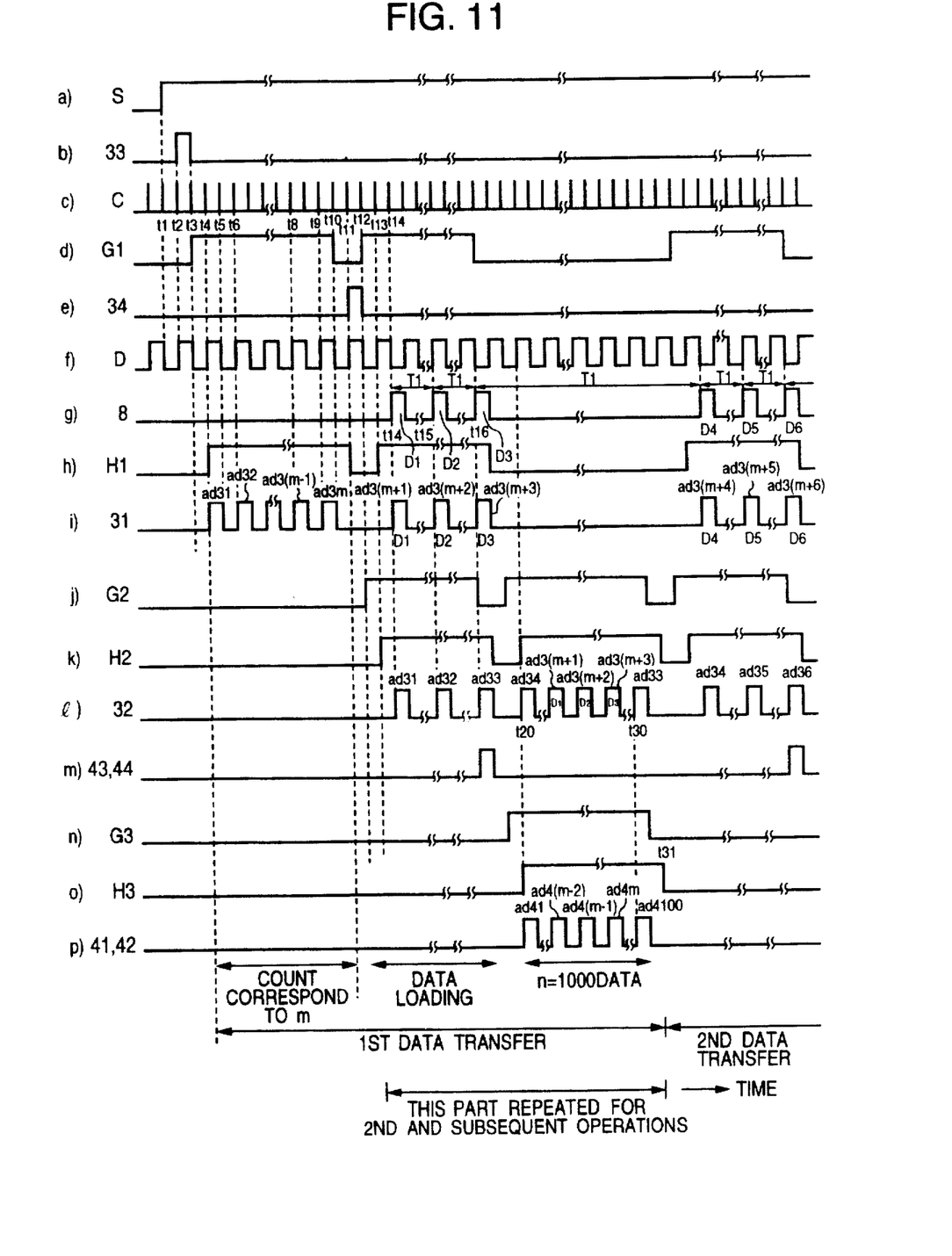
FIG. 11 is a timing chart showing waveforms of signals appearing at various points in FIG. 5 for explaining the operation of the embodiment in the roll mode.
Figure 12:
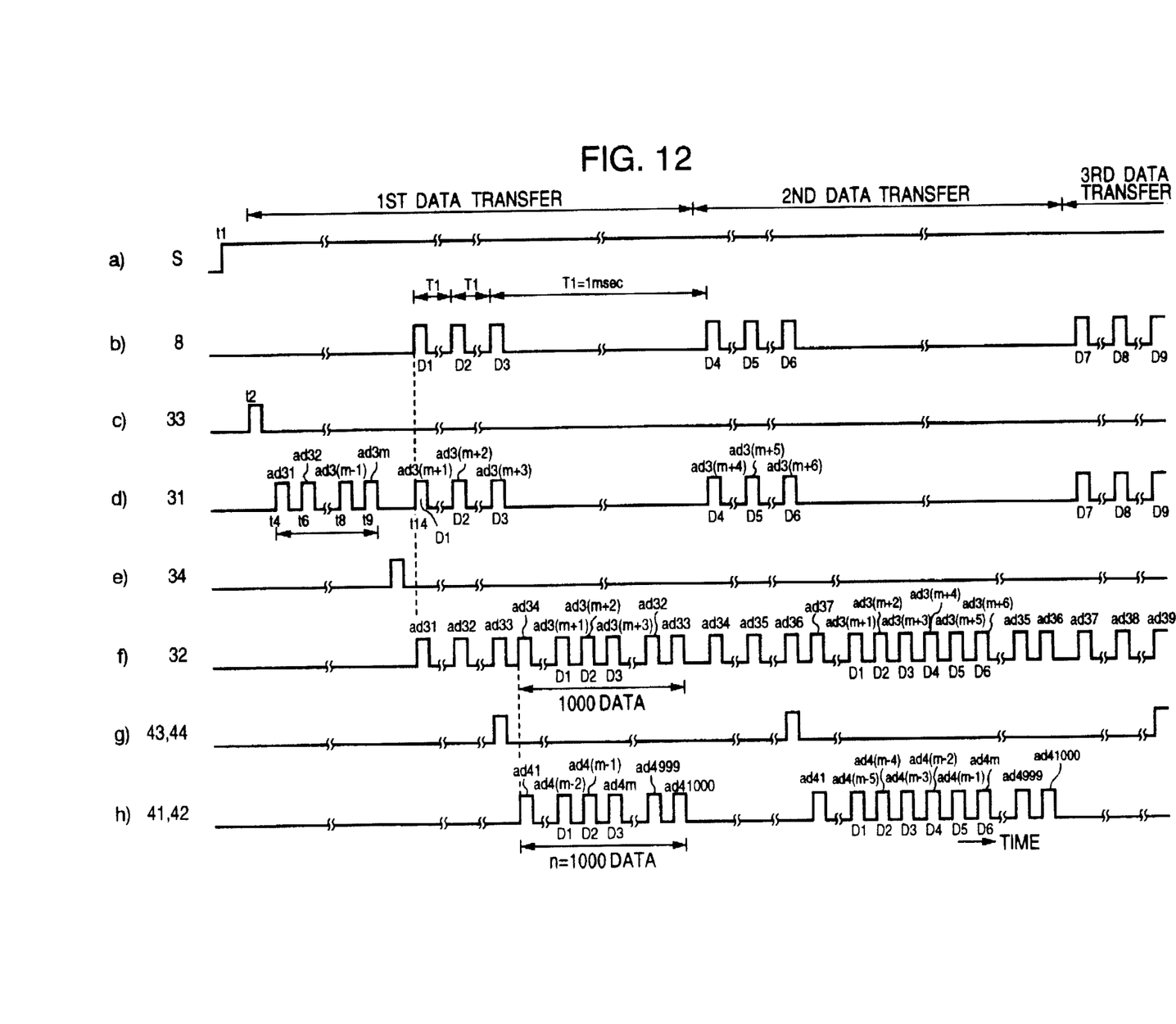
FIG. 12 is a timing chart showing waveforms of signals appearing at various points in FIG. 5 for explaining the writing and reading operations of the acquisition memory and display memory in roll mode of the embodiment.

FIGS. 10A to 10F are diagrams for explaining the data re-arranging operation of the present embodiment in the roll mode; and FIGS. 11 and 12 are timing charts showing waveforms of signals appearing at various points in FIG. 5 for explaining the operation of the present embodiment in the roll mode.

In the present embodiment, a series circuit of the acquisition memory 3 of dual port type and the serial access memory as the display memory 4 is connected to the output of the A/D converter 2 as shown in FIG. 5, so that, even when the address length of the second-stage serial access memory or display memory 4 does not coincide with the display length of the display unit 13, a difference is previously provided between the write and read addresses of the first-stage serial access memory or acquisition memory 3 to provide a 1:1 relationship between part of the display memory 4 and the screen display, whereby data transfer can be carried out from the acquisition memory 3 to the display memory 4.

The operation of the present embodiment will be explained below by referring to FIGS. 5 and 10A to 12. First, in response to the start signal S (FIG. 11, (a); FIG. 12, (a)) received from the microprocessor 7 at a time t1, the logical decoder 61 provides the write reset pulse 33 (FIG. 11, (b); FIG. 12, (c)) of the acquisition memory 3 to the acquisition memory 3 at a time t2 to reset its write address. Thereafter, at the time t3, the gate signal G1 (FIG. 11, (d)) for the write operation of the acquisition memory 3 is changed to its high level and thereafter the high level is kept until a time t10 during which the clock pulse D is generated by a number corresponding to the display data piece number m of the display screen.

Responsive to the gate signal G1, the counter 64 generates the gate signal H1 (FIG. 11, (h)) (that is, the signal H1 is changed to and kept at its high level) during a time period of times t4–t10. Accordingly, m of the write clocks 31 (FIG. 11, (i); FIG. 12, (d)) are provided in synchronism with the clock D from the logical gate 66 to the counter 64 during a time period of t4–t10 so that the write address of the acquisition memory 3 is updated to ad31, ad32, . . . , ad3(m−1) and ad3m.

Next, the logical decoder 61 generates at a time t11 the read reset pulse 34 (FIG. 11, (e); FIG. 12, (e)) to reset the read address of the acquisition memory 3. The subsequent operation is substantially the same as that of the first embodiment subsequent to the time t2 of FIGS. 7 and 8. Thus, at this time point, the write address of the acquisition memory 3 is advanced by m with respect to the read address.

After this, the write and read clocks 31 and 32 are both provided from the logical gate 66 to the acquisition memory 3, the sampled data D1, D2 and D3 are stored at the write addressed ad3(m+1), ad3(m+2) and ad3(m+3) of the acquisition memory 3 at times t14, t15 and t16 respectively in response to the A/D clock 8 (see FIG. 10A), during which the read addresses ad31, ad32 and ad33 of the acquisition memory 3 are also updated.

Thereafter, the write and read addresses of the display memory 4 are reset so that the read clock 32 (FIG. 11, (l); FIG. 12, (f)) is provided to the acquisition memory 3 and the write and read clocks 41 and 42 (FIG. 11, (p); FIG. 12, (h)) are provided to the display memory 4 during a time period of times t20–t30 respectively by n (n=1,000 in this example). Accordingly, the data are sequentially read out starting with the address ad34 of the acquisition memory 3, the read-out data are sequentially written in the display memory 4 at the addresses starting with the address ad41, and then the data written in the display memory 4 are sequentially read out from the addresses starting with the address ad41 to be displayed. In this way, the data stored at the addresses ad34 to ad3m of the acquisition memory 3 are stored at addresses ad42 to ad4(m−3) of the display memory 4 respectively; while the data D1, D2 and D3 stored at the addresses ad3(m+1), ad3(m+2) and ad3(m+3) of the acquisition memory 3 are stored at addresses ad4(m−2), ad4(m−1) and ad4m of the display memory 4 respectively. As a result, the data D3, D2 and D1 are displayed from the right end of the display screen of the display unit 13 as shown in FIG. 10C. In this way, the first data sampling and data transfer operations are carried out.

The second data sampling and data transfer operations correspond to the repetitive operations between times t12 and t31 in FIG. 12 and are shown in FIGS. 10D to 10F, and explanation thereof is omitted.

Thus, when the contents of all the addresses of the display memory 4 are transferred to the display circuit 5, the data to be observed can be displayed on the display unit 13 with a short time.

In accordance with the present embodiment, even when the data piece number of the display screen is smaller than the data piece number (address number) of the acquisition and display memories, a time taken from the data input to the display thereof on the display screen can be made short so that the screen display can be done on a virtual real time basis with the waveform being displayed as if it were being moved smoothly.

As has been explained in the foregoing, the present invention is effective especially in the roll operational mode, but even in the normal mode, the invention can be implemented without imposing any increased burden on the microprocessor. That is, the data subjected at the A/D converter to the A/D conversion are loaded into the acquisition memory 3 by an amount corresponding to one display screen. At this time, the write and read addresses of the acquisition memory 3 are simultaneously advanced and stopped when the loading of the data corresponding to one display screen are completed. Then the read address of the acquisition memory 3 and the write address of the display memory 4 are advanced simultaneously by addresses corresponding to one display screen respectively starting with an address next to the stopped address and with the reset 0 address, so that the waveform data for display is stored in the display memory 4. When the data stored in the display memory 4 are sequentially read out therefrom to the display circuit 5, the data of the display circuit 5 is updated to new data.

In accordance with the present invention, further, since power consumption can be reduced, the invention is suitable, in particular, for such a portable digital oscilloscope as operated on a battery.

The present invention eliminates the need for the microprocessor to perform the data re-arranging operation for the data transfer from the acquisition memory to the display memory. For this reason, the data transfer rate can be increased and therefore the dead time of the data loading can be made short. In addition, a high-speed roll mode can be realized.

What is claimed is:

1. A system for storing waveform data on a digital oscilloscope comprising:

an input circuit for inputting a signal to be observed, subjecting the input signal to a level adjustment to obtain a level-adjusted observation signal and outputting the observation signal;

an analog-to-digital (A/D) converter, in response to a sampling clock, for converting the signal received from the input circuit into digital waveform data and outputting the digital waveform data;

an acquisition memory of a dual port, serial access type for storing therein, in response to a first write clock synchronized with said sampling clock, the digital waveform data received from the A/D converter and for reading therefrom, in response to a first read clock, the data stored therein;

a display memory of the dual port, serial access type for storing therein, in response to a second write clock, the waveform data read out from the acquisition memory and for reading out therefrom, in response to a second read clock, the data; and a clock generation circuit for generating said first and second write clocks and said first read clocks, wherein said clock generation circuit provides said first write and read clocks to said acquisition memory so that, in a roll operational mode, whenever a predetermined number of pieces of the waveform data are stored in said acquisition memory for each passage of a predetermined period, the waveform data stored in the acquisition memory are read out in an order that the latest waveform data of all data stored in the acquisition memory is last read out therefrom, and eventually data at all addresses of the acquisition memory are read out therefrom.

2. A system as set forth in claim 1, wherein said acquisition memory updates the write address thereof and stores the waveform data received from said A/D converter at the updated write address in response to said first write clock, and also reads out the waveform data at the read address updated and provides it to said display memory in response to said first read clock; and said display memory updates the write address thereof and stores the waveform data received from said acquisition memory at the updated write address in response to said second write clock, and also reads out the waveform data at the read address updated in response to a second read clock.

3. A system as set forth in claim 2, wherein said clock generation circuit resets the addresses of said acquisition and display memories at the beginning of said roll operational mode; said acquisition memory, said roll operational mode, has a write mode in which said predetermined number of pieces of waveform data sequentially received from said A/D converter are sequentially written at the address updated in response to said first write clock and a read mode in which, whenever said write mode of the acquisition memory is terminated, all the data are sequentially read out from the addresses starting with the address next to the address at which the latest waveform data was stored in response to said first read clock; and said display memory has a write mode in which the data read out from said acquisition memory are sequentially written at all the addresses thereof starting with its header address ending in a predetermined address in response to said second write clock and a read mode in which the data at the addresses ranging from its header address to the predetermined address are sequentially read out therefrom in response to said second read clock.

4. A system as set forth in claim 3, wherein, in said roll operation mode, said clock generation circuit generates said first write clock for storing the digital waveform data received from said A/D converter into said acquisition memory, and generates said first read clock so that the read address of said acquisition memory is advanced by all read addresses or more thereof before the next write mode of said acquisition memory.

5. A system as set forth in claim 3, wherein, in said roll operational mode, said clock generation circuit generates a third read clock synchronized with said first write clock in the write mode of said acquisition memory as said first read clock, while generates a fourth read clock of a frequency corresponding to a frequency multiplication of said first write clock by N (N being an integer equal to or larger than an address number of the acquisition memory) in said read mode of the acquisition memory, and generates said second write clock in synchronism with said fourth read clock.

6. A system as set forth in claim 5, wherein the number of said fourth read clockd generated in the read mode of said acquisition memory corresponds to the address number of said acquisition memory.

7. A digital oscilloscope comprising:

an input circuit for inputting a signal to be observed, subjecting the input signal to a level adjustment to obtain a level-adjusted observation signal and outputting the observation signal;

an analog-to-digital (A/D) converter, in response to a sampling clock, for converting the signal received from the input circuit into digital waveform data and outputting the digital waveform data;

an acquisition memory of a dual port, serial access type for storing therein, in response to a first write clock synchronized with said sampling clock, the digital waveform data received from the A/D converter and for reading therefrom, in response to a first read clock, the data stored therein;

a display memory of the dual port, serial access type for storing therein, in response to a second write clock, the waveform data read out from the acquisition memory and for reading out therefrom, in response to a second read clock, the data;

a clock generation circuit for generating said first and second write clocks and said first read clock; and a display unit for sequentially displaying thereon the data read out from said display memory, wherein said clock generation circuit provides said first write and read clocks to said acquisition memory so that, in a roll operational mode, whenever a predetermined number of pieces of the waveform data are stored in said acquisition memory for each passage of a predetermined period, the waveform data stored in the acquisition memory are read out in an order that the latest waveform data of all data stored in the acquisition memory is last read out therefrom, eventually data at all addresses of the acquisition memory are read out therefrom, and said display unit updates the displayed data on the basis of the data read out from said display memory for each passage of said predetermined period.

8. A digital oscilloscope as set forth in claim 7, wherein said acquisition memory updates the write address thereof and stores the waveform data received from said A/D converter at the updated write address in response to said first write clock, and also reads out the waveform data at the read address updated and provides it to said display memory in response to said first read clock; and said display memory updates the write address thereof and stores the waveform data received from said acquisition memory at the updated write address in response to said second write clock, and also reads out the waveform data at the read address updated in response to said second read clock.

9. A digital oscilloscope as set forth in claim 8, wherein said clock Generation circuit resets the addresses of said acquisition and display memories at the beginning of said roll operational mode; said acquisition memory, said roll operational mode, has a write mode in which said predetermined number of pieces of waveform data sequentially received from said A/D converter are sequentially written at the address updated in response to said first write clock and a read mode in which, whenever said write mode of the acquisition memory is terminated, all the data are sequentially read out from the addresses starting with the address next to the address at which the latest waveform data was stored in response to said first read clock; and said display memory has a write mode in which the data read out from said acquisition memory are sequentially written at all the addresses thereof starting with its header address in a predetermined address in response to said second write clock and a read mode in which the data at the addresses ranging from its header address to the predetermined address are sequentially read out therefrom in response to said second read clock.

10. A digital oscilloscope as set forth in claim 9, wherein, in said roll operation mode, said clock generation circuit generates said first write clock for storing the digital waveform data received from said A/D converter into said acquisition memory, and generates said first read clock so that the read address of said acquisition memory is advanced by all read addresses or more thereof before the next write mode of said acquisition memory.

11. A digital oscilloscope as set forth in claim 9, wherein, in said roll operational mode, said clock generation circuit generates a third read clock synchronized with said first write clock in the write mode of said acquisition memory as said first read clock, while generates a fourth read clock of a frequency corresponding to a frequency multiplication said first write clock by N (N being an integer equal to or larger than an address number of the acquisition memory) in said read mode of the acquisition memory, and generates said second write clock in synchronism with said fourth read clock.

12. A digital oscilloscope as set forth in claim 11, wherein the number of said fourth read clock generated in the read mode of said acquisition memory corresponds to the address number of said acquisition memory.

13. A digital oscilloscope as set forth in claim 8, wherein said clock generation circuit resets the addresses of said acquisition memory at the initial stage of said roll operational mode, and thereafter and prior to generation of said first write clock, provides the clocks corresponding in number to the number m (dot number) of display pieces of data of said display unit in a horizontal direction to said acquisition memory as the write clocks to advance the write address of the acquisition memory by a number m.

14. A digital oscilloscope as set forth in claim 13, wherein said clock generation circuit resets the addresses of said acquisition and display memories at the beginning of said roll operational mode; said acquisition memory, said roll operational mode, has a write mode in which said predetermined number of pieces of waveform data sequentially received from said A/D converter are sequentially written at the address updated in response to said first write clock and a read mode in which, whenever said write mode of the acquisition memory is terminated, all the data are sequentially read out from the addresses starting with the address next to the address at which the latest waveform data was stored (the data was stored at the very end of the write mode terminated immediately before) in response to said first read clock; and said display memory has a write mode in which the data read out from said acquisition memory are sequentially written at all the addresses thereof starting with its header address ending in a predetermined address in response to said second write clock and a read mode in which the data at the addresses ranging from its header address to the predetermined address are sequentially read out therefrom in response to said second read clock.

15. A digital oscilloscope as set forth in claim 14, wherein, in said roll operation mode, said clock generation circuit generates said first write clock for storing the digital waveform data received from said A/D converter into said acquisition memory, and generates said first read clock so that the read address of said acquisition memory is advanced by all read addresses or more thereof before the next write mode of said acquisition memory.

16. A digital oscilloscope as set forth in claim 14, wherein, in said roll operational mode, said clock generation circuit generates a third read clock synchronized with said first write clock in the write mode of said acquisition memory as said first read clock, while generates a fourth read clock of a frequency corresponding to a frequency multiplication of said first write clock by N (N being an integer equal to or larger than an address number of the acquisition memory) in said read mode of the acquisition memory, and generates said second write clock in synchronism with said fourth read clock.

17. A digital oscilloscope as set forth in claim 16, wherein the number of said fourth read clockd generated in the read mode of said acquisition memory corresponds to the address number of said acquisition memory.

18. A digital oscilloscope comprising:

an input circuit for inputting a signal to be observed, subjecting the input signal to a level adjustment to obtain a level-adjusted observation signal and outputting the observation signal;

an analog-to-digital (A/D) converter, in response to a sampling clock, for converting the signal received from the input circuit into digital waveform data and outputting the digital waveform data;

an acquisition memory of a dual port, serial access type for storing therein, in response to a first write clock synchronized with said sampling clock, the digital waveform data received from the A/D converter and for reading therefrom, in response to a first read clock, the data stored therein;

a display memory of the dual port, serial access type for storing therein, in response to a second write clock, the waveform data read out from the acquisition memory and for reading out therefrom, in response to a second read clock, the data;

a display unit for displaying thereon the waveform data stored in said display memory; and a clock generation circuit for generating said first and second write clocks and said first read clock, wherein said clock generation circuit provides said first write and read clocks to said acquisition memory and said first read clock to said display memory so that, in a roll operational mode, whenever a predetermined number of pieces of the waveform data are stored in said acquisition memory for each passage of a predetermined period, the waveform data stored in the acquisition memory are read out in response to said first read clock and transferred to said display memory and said display memory stores the waveform data transferred from said acquisition memory in response to said second read clock.

* * * * *